(12) United States Patent
Wang et al.

(10) Patent No.: US 10,177,344 B2
(45) Date of Patent: Jan. 8, 2019

(54) DISPLAY PANEL AND METHOD FOR MANUFACTURING THE SAME

(71) Applicants: Shanghai Tianma AM-OLED Co., Ltd., Shanghai (CN); TIANMA MICRO-ELECTRONICS CO., LTD., Shenzhen (CN)

(72) Inventors: Xiangcheng Wang, Shanghai (CN); Jinghua Niu, Shanghai (CN); Yuji Hamada, Shanghai (CN); Wanming Hua, Shanghai (CN); Wei He, Shanghai (CN); Shuang Cheng, Shanghai (CN)

(73) Assignees: Shanghai Tianma AM-OLED Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/616,943

(22) Filed: Jun. 8, 2017

(65) Prior Publication Data
US 2017/0271623 A1    Sep. 21, 2017

(30) Foreign Application Priority Data

Dec. 23, 2016   (CN) .......................... 2016 1 1206654

(51) Int. Cl.
*H01L 51/52*   (2006.01)
*H01L 51/50*   (2006.01)
*G02F 1/167*   (2006.01)

(52) U.S. Cl.
CPC ...... *H01L 51/5268* (2013.01); *H01L 51/5275* (2013.01); *G02F 1/167* (2013.01); *H01L 51/5256* (2013.01)

(58) Field of Classification Search
CPC ............. H01L 51/5268; H01L 51/5253; H01L 51/5265; H01L 51/5275; H01L 51/56
See application file for complete search history.

(56) References Cited

U.S. PATENT DOCUMENTS

| | | | | |
|---|---|---|---|---|
| 2012/0234460 A1* | 9/2012 | Zhang | ................... | B82Y 20/00 156/67 |
| 2013/0334511 A1* | 12/2013 | Savas | ..................... | H01L 51/56 257/40 |

(Continued)

FOREIGN PATENT DOCUMENTS

| | | |
|---|---|---|
| CN | 102569658 A | 7/2012 |
| CN | 103150965 A | 6/2013 |

(Continued)

*Primary Examiner* — Christine Enad
(74) *Attorney, Agent, or Firm* — Kilpatrick Townsend & Stockton LLP

(57) ABSTRACT

A display panel and a method for manufacturing the same are disclosed. The display panel includes: a substrate, a display element located on the substrate, and a thin-film encapsulation layer located on the display element. The thin-film encapsulation layer includes at least one first encapsulation material layer and at least one second encapsulation material layer; the refractive index of the first encapsulation material layer is different from that of the second encapsulation material layer; wherein, at least one of the first encapsulation material layers is provided with a plurality of grooves; the grooves are filled with the second encapsulation material layer above the first encapsulation material layer provided with a plurality of grooves.

23 Claims, 15 Drawing Sheets

(56) References Cited

U.S. PATENT DOCUMENTS

2016/0197311 A1* 7/2016 Lamansky .......... H01L 51/5275
                                                     257/40
2016/0359083 A1* 12/2016 Hao ..................... H01L 33/12
2017/0125728 A1* 5/2017 Dighde ............... H01L 27/3258
2017/0263890 A1* 9/2017 Chun .................. H01L 51/524

FOREIGN PATENT DOCUMENTS

| CN | 103633248 A | 3/2014 | |
|---|---|---|---|
| CN | 105027671 A | 11/2015 | |
| CN | 105206763 A | 12/2015 | |
| CN | 105552246 A | 5/2016 | |
| CN | 105576148 A | 5/2016 | |
| CN | 106252526 A | 12/2016 | |
| JP | WO 2014167758 A1 * | 10/2014 | ......... H01L 51/5275 |
| JP | 2016066482 A | 4/2016 | |

* cited by examiner

DISPLAY PANEL AND METHOD FOR MANUFACTURING THE SAME

CROSS-REFERENCE TO RELATED APPLICATIONS

This application claims priority to Chinese Patent Application No. 201611206654.5, filed on Dec. 23, 2016 and entitled "DISPLAY PANEL AND METHOD FOR MANUFACTURING THE SAME", the disclosure of which is incorporated herein by reference in its entirety.

TECHNICAL FIELD

Embodiments of the present invention relate to display technologies, and in particular, to a display panel and a method for manufacturing the same.

BACKGROUND

With the rapid growth of the demand for portable mobile devices and wearable devices, etc., flexible display technologies have been developed greatly in recent years. Among display technologies by which the flexible display can be realized, Organic Light-Emitting Diode (OLED) is regarded as one of the most promising flexible display technologies due to its advantages of bending resistance, fast response speed, wide visual angle and light weight, etc.

OLED devices are very sensitive to aqueous vapor and oxygen, and hence an OLED device which contacts aqueous vapor and oxygen will degrade its working stability and reduce its lifetime. Therefore, the lifetime of an OLED device may be prolonged by preventing, via an encapsulation structure, aqueous vapor and oxygen from invading.

At present, the encapsulation of an OLED device is usually realized based on a stacked layer of an organic layer and an inorganic layer so as to prevent aqueous vapor and oxygen from invading. However, such the encapsulation structure has a poor encapsulation effect, and tends to crack during bending; moreover, due to the low light extraction efficiency, the light-emitting efficiency and the lifetime of the device will be affected.

SUMMARY

Embodiments can provide a display panel and a method for manufacturing the same, thereby improving the light-emitting efficiency and the lifetime of the display panel.

In a first aspect, embodiments of the application provide a display panel, which includes:

a substrate and a display element located on the substrate;

a thin-film encapsulation layer located on the display element, wherein the thin-film encapsulation layer includes at least one first encapsulation material layer and at least one second encapsulation material layer, and the refractive index of the first encapsulation material layer is different from that of the second encapsulation material layer;

wherein, at least one of the first encapsulation material layers is provided with a plurality of grooves, and the grooves are filled with the second encapsulation material layer above the first encapsulation material layer provided with a plurality of grooves.

In a second aspect, embodiments of the present invention further provide a method for manufacturing a display panel, which includes:

forming a display element on a substrate;

forming a first encapsulation material layer which is provided with a plurality of grooves;

forming a second encapsulation material layer, wherein the grooves are filled with the second encapsulation material layer, and the refractive index of the first encapsulation material layer is different from that of the second encapsulation material layer.

In the display panel according to the embodiments of the present invention, the thin-film encapsulation layer includes at least one first encapsulation material layer and at least one second encapsulation material layer, wherein, the at least one first encapsulation material layer is provided with a plurality of grooves, and the grooves are filled with a second encapsulation material layer above the first encapsulation material layer provided with a plurality of grooves. On one hand, the first encapsulation material layer provided with a plurality of grooves is disconnected by the second encapsulation material layer and hence has a discontinuous structure, and the second encapsulation material layer is also disconnected by the first encapsulation material layer provided with a plurality of grooves, and hence also has a discontinuous structure. Therefore, when the display panel is bent, the stress may be released by the discontinuous structure, so that cracks caused by the accumulation of the stress during bending may be avoided, and hence the invasion of ambient aqueous vapor and oxygen due to the cracks in the first encapsulation material layer or the second encapsulation material layer may be prevented, thereby improving the lifetime of the display panel. On the other hand, because a plurality of grooves are provided in the first encapsulation material layer, and the grooves are filled with a second encapsulation material layer above the first encapsulation material layer provided with a plurality of grooves, the first encapsulation material layer and the second encapsulation material layer are arranged alternately, and when the light emitted by the display element is emitted outward, the total reflection of the light on the interface between the display element and the thin-film encapsulation layer, on the interface between the first encapsulation material layer and the second encapsulation material layer of the thin-film encapsulation layer and on the interface between the thin-film encapsulation layer and the air may be interfered by scattering and diffraction. Moreover, the larger difference between the refractive indexes of the first encapsulation material layer and the second encapsulation material layer would result in the more apparent scattering or diffraction effect, so that the light extraction efficiency may be improved.

DETAILED DESCRIPTION

Figure 1:
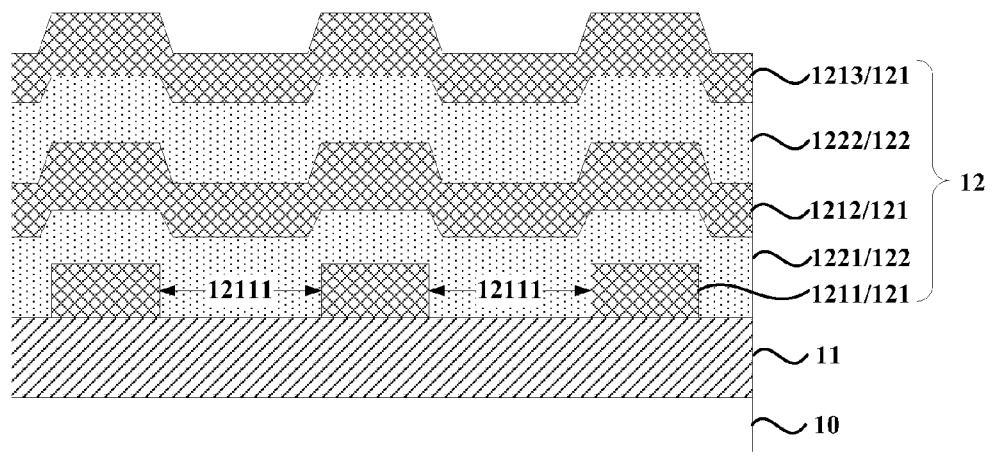
FIG. 1 is a sectional view of a display panel according to one embodiment of the present invention.

The present invention will be further illustrated in detail in conjunction with the drawings and embodiments. It may be understood that, the specific embodiments described here are only for explaining, rather than limiting, the present invention. Additionally, it further needs to be noted that, for easy description, the drawings only show the parts related to the disclosure, rather than the entire structure.

One embodiment of the application provides a display panel, which includes: a substrate, a display element located on the substrate, and a thin-film encapsulation layer located on the display element. For example, the display element, which may be an organic light-emitting display element in this embodiment, includes a cathode, an anode and a light-emitting functional layer located between the cathode and the anode. The display element may also include at least one of an electron injection layer, an electron transport layer and a hole blocking layer located between the light-emitting functional layer and the cathode, and at least one of a hole injection layer, a hole transport layer and an electron blocking layer located between the light-emitting functional layer and the anode. In addition, the display element for example may also be an electrophoretic display element, etc. As for the electrophoretic display element, pigment particulates are mixed into an appropriate liquid to form a suspension liquid which is in turn placed between two parallel plate electrodes (at least one of which is a transparent electrode), so that display may be realized based on the movement of the particulates under the action of an electric field. In the embodiments of the present invention, the type of the display element is not limited. The thin-film encapsulation layer located on the display element includes at least one first encapsulation material layer and at least one second encapsulation material layer both for realizing the encapsulation of the display element in order to, for example, avoid the invasion of aqueous vapor and oxygen. The first encapsulation material layer and the second encapsulation material layer may respectively be an organic layer and an inorganic layer, for example, and ambient aqueous vapor and oxygen may be blocked by a stacked layer of the organic layer and the inorganic layer. It should be noted that, in the present invention, the material types of the first encapsulation material layer and the second encapsulation material layer are not particularly limited, for example, the first encapsulation material layer is an inorganic layer, and the second encapsulation material layer is an organic layer, or alternatively, the first encapsulation material layer is an organic layer, and the second encapsulation material layer is an inorganic layer, and the like. In this embodiment, the refractive indexes of the first encapsulation material layer and the second encapsulation material layer are different from each other; moreover, a plurality of grooves are provided in at least the first encapsulation material layer of the thin-film encapsulation layer, and the grooves are filled with the second encapsulation material layer above the first encapsulation material layer. Therefore, in the plane perpendicular to the groove depth in the grooves, the first encapsulation material and the second encapsulation material are arranged alternately. The first encapsulation material layer set with a plurality of grooves is disconnected by the second encapsulation material layer and hence has a discontinuous structure, and the second encapsulation material layer is also disconnected by the first encapsulation material layer set with a plurality of grooves, and hence also has a discontinuous structure. Therefore, when the display panel is bent, the stress may be released by such the discontinuous structure, so that cracks caused by the accumulation of the stress during bending may be avoided, and hence the invasion of ambient aqueous vapor and oxygen due to the cracks in the first encapsulation material layer or the second encapsulation material layer may be prevented, and the lifetime of the display panel may be improved. When the light emitted by the display element is emitted outward, the total reflection of the light on the interface between the display element and the thin-film encapsulation layer, on the interface between the first encapsulation material layer and the second encapsulation material layer of the thin-film encapsulation layer and on the interface between the thin-film encapsulation layer and the air may be interfered by means of scattering and diffraction. Moreover, the scattering or diffraction effect would be more apparent with the increase of the difference between the refractive indexes of the first encapsulation material layer and the second encapsulation material layer, so that the light efficiency may be improved.

The above shows the core concept of the present invention. The technical solutions of the embodiments of the present invention will be described clearly and fully below in conjunction with the drawings in the embodiments of the present invention. All other embodiments obtained by one of ordinary skills in the art based on the embodiments of the present invention without creative work will pertain to the protection scope of the present invention.

FIG. 1 is a sectional view of a display panel according to one embodiment of the present invention. As shown in FIG. 1, the display panel includes a substrate 10, a display element 11 located on the substrate 10 and a thin-film encapsulation layer 12 located on the display element 11. The thin-film encapsulation layer 12 includes at least one first encapsulation material layer 121 and at least one second encapsulation material layer 122. The refractive indexes of the first encapsulation material layer 121 and the second encapsulation material layer 122 are different from each other. In the embodiments of the present invention, the number of the first encapsulation material layer 121 and the second encapsulation material layer 122 is not limited. Exemplarily in FIG. 1, the thin-film encapsulation layer 12 includes three first encapsulation material layers 121 and two second encapsulation material layers 122. For easy description, along the direction departing from the substrate 10 in FIG. 1, the first encapsulation material layers in FIG. 1 include in turn a first encapsulation material layer 1211, a first encapsulation material layer 1212 and a first encapsulation material layer 1213, and the second encapsulation material layers in FIG. 1 include in turn a second encapsulation material layer 1221 and a second encapsulation material layer 1222. Referring to FIG. 1, the first encapsulation material layer 1211 is provided with a plurality of grooves 12111, and the grooves 12111 are filled with the second encapsulation material layer 1221 above the first encapsulation material layer 1211 that is provided with a plurality of grooves 12111. Exemplarily in FIG. 1, in the direction perpendicular to the plane including the substrate 10, the grooves 12111 extend through the first encapsulation material layer 1211, that is, the film layer under the first encapsulation material layer 1211 is exposed.

Figure 2:
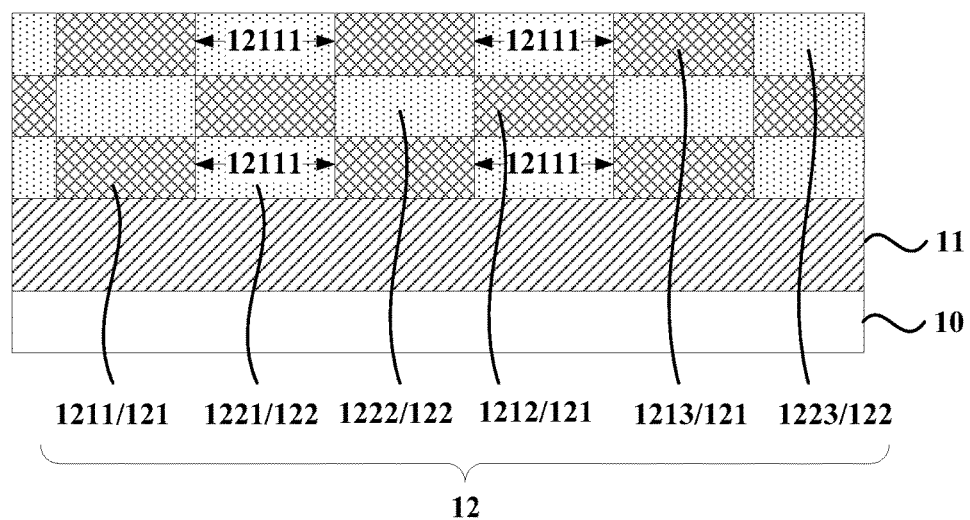
FIG. 2 is a sectional view of another display panel according to one embodiment of the present invention.

FIG. 2 is a sectional view of another display panel according to one embodiment of the present invention. As shown in FIG. 2, the display panel includes a substrate 10, a display element 11 located on the substrate 10 and a thin-film encapsulation layer 12 located on the display element 11. The thin-film encapsulation layer 12 includes at least one first encapsulation material layer 121 and at least one second encapsulation material layer 122. The refractive indexes of the first encapsulation material layer 121 and the second encapsulation material layer 122 are different from each other. In FIG. 2, each of the first encapsulation material layers of the thin-film encapsulation layer is provided with a plurality of grooves, and the grooves on each of the first encapsulation material layers all extend through the first encapsulation material layer. Specifically, as shown in FIG. 2, the first encapsulation material layer 1211, the first encapsulation material layer 1212 and the first encapsulation material layer 1213 each are provided with a plurality of grooves 12111. The grooves 12111 are filled with the second encapsulation material layer 1221; the grooves 12111 are filled with the second encapsulation material layer 1222 located on the first encapsulation material layer 1212; and the grooves 12111 are filled with the second encapsulation material layer 1223 located on the first encapsulation material layer 1213.

Figure 3:
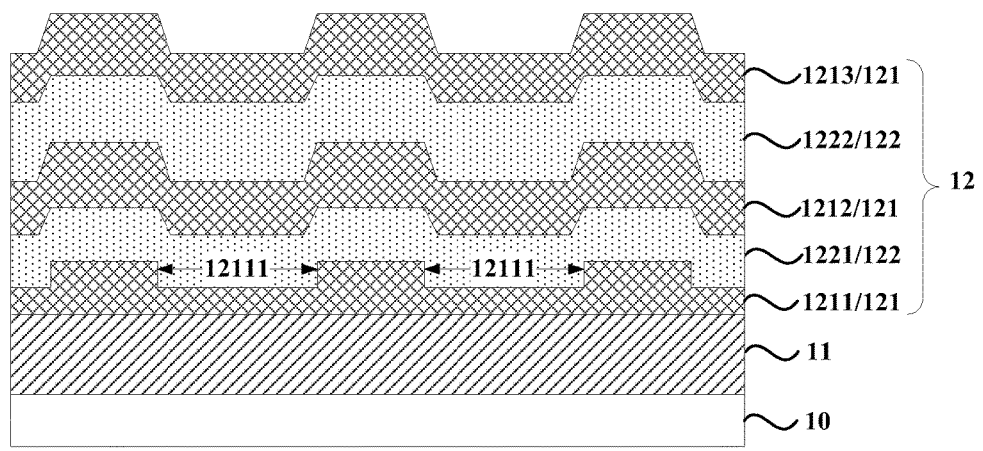
FIG. 3 is a sectional view of another display panel according to one embodiment of the present invention.

FIG. 3 is a sectional view of another display panel according to one embodiment of the present invention. As shown in FIG. 3, the display panel includes a substrate 10, a display element 11 located on the substrate 10 and a thin-film encapsulation layer 12 located on the display element 11. The thin-film encapsulation layer 12 includes at least one first encapsulation material layer 121 and at least one second encapsulation material layer 122. The refractive indexes of the first encapsulation material layer 121 and the second encapsulation material layer 122 are different from each other. Exemplarily in FIG. 3, the thin-film encapsulation layer 12 includes three first encapsulation material layers 121 and two second encapsulation material layers 122. For easy description, along the direction departing from the substrate 10 in FIG. 2, the first encapsulation material layers in FIG. 3 include in turn a first encapsulation material layer 1211, a first encapsulation material layer 1212 and a first encapsulation material layer 1213, and the second encapsulation material layers in FIG. 3 include in turn a second encapsulation material layers 1221 and a second encapsulation material layers 1222. Referring to FIG. 3, the first encapsulation material layer 1211 is provided with a plurality of grooves 12111, and the grooves 12111 are filled with the second encapsulation material layer 1221 above the first encapsulation material layer 1211 that is provided with a plurality of grooves 12111. In FIG. 3, the depth of the grooves 12111 is less than that of the first encapsulation material layer 1211. For example, the grooves 12111 may be formed via an etching process, or it may be formed via a nano-imprint process.

Figure 4:
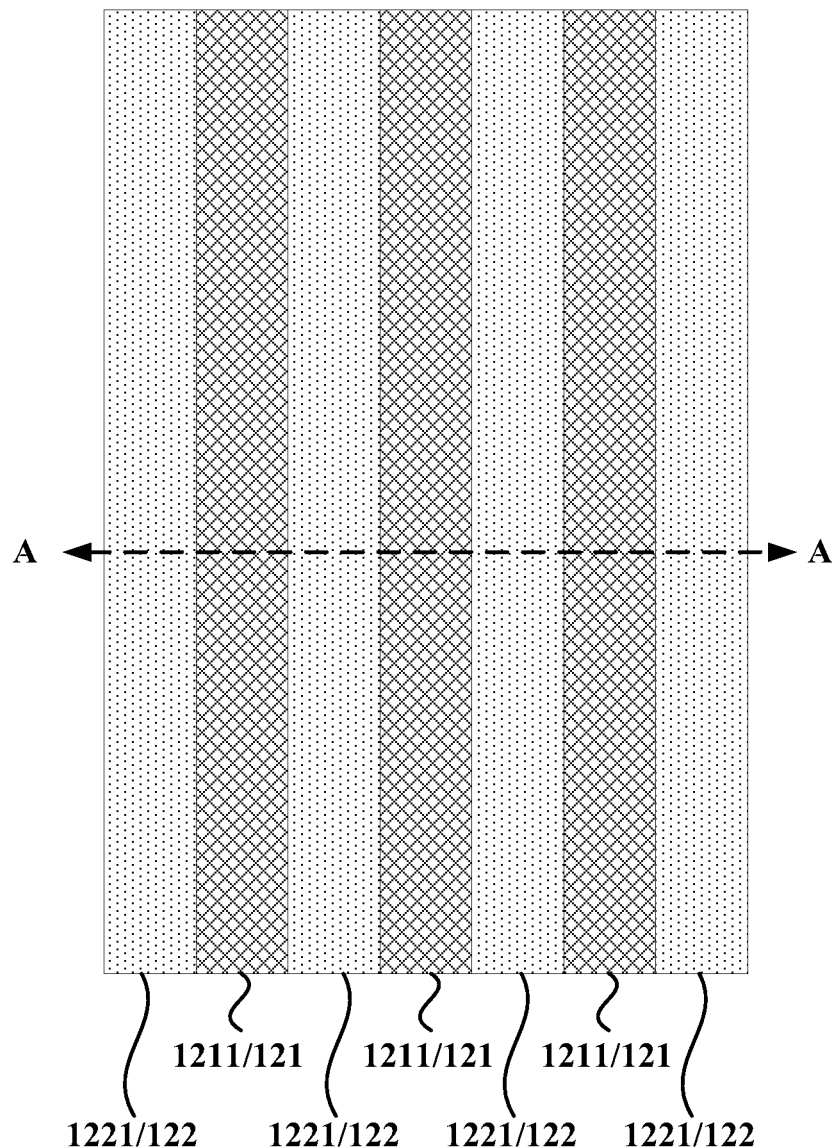
FIG. 4 is a top view of grooves 12111 filled with a second encapsulation material layer 1221.

It should be noted that, in the direction parallel with the plane including the substrate 10, the grooves 12111 may form a one-dimensional array structure or a two-dimensional array structure. FIG. 4 is a top view of grooves 12111 filled with a second encapsulation material layer 1221. As shown in FIG. 4, in the direction parallel with the plane including the substrate 10, the plurality of grooves 12111, which form a one-dimensional array structure, are arranged in parallel and are filled with the second encapsulation material layer 1221; along the direction AA in FIG. 4, the second encapsulation material layer 1221 and the second encapsulation material layer 1222 are arranged alternately. With the plurality of grooves 12111 set in a one-dimensional array structure, the light emitted by the display element may be scattered and diffracted in direction A-A, so that the total reflection of the light may be interfered, and hence the light extraction efficiency may be improved.

Figure 5:
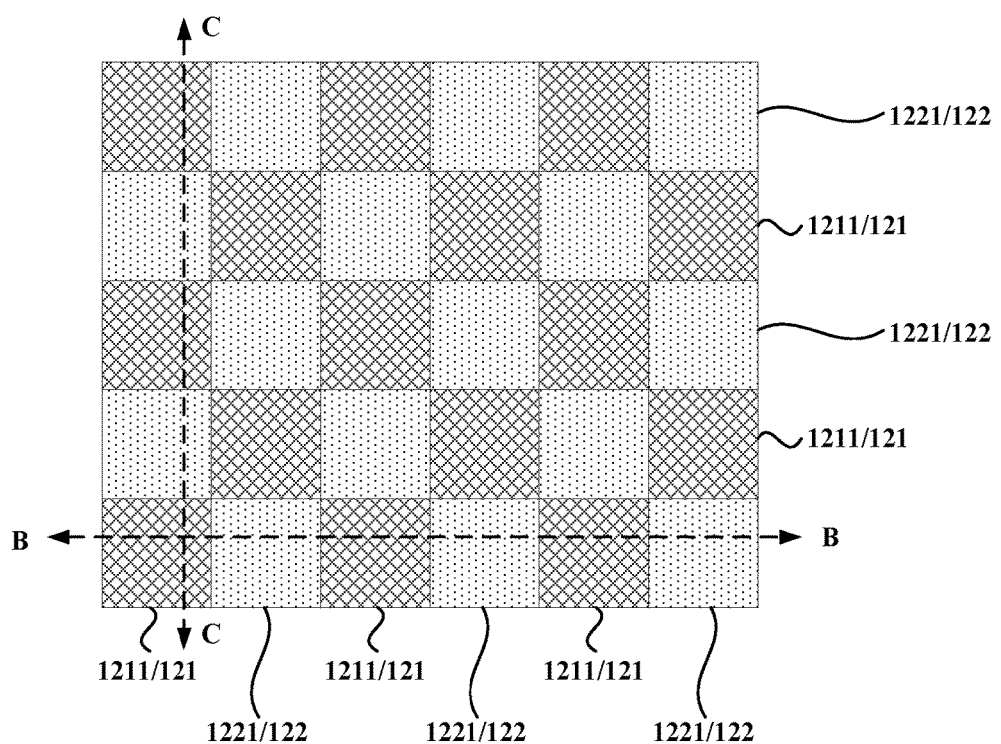
FIG. 5 is a top view of another grooves 12111 filled with a second encapsulation material layer 1221.

FIG. 5 is a top-view of another grooves 12111 filled with a second encapsulation material layer 1221. As shown in FIG. 5, in the direction parallel with the plane including the substrate 10, the plurality of grooves 12111, which form a two-dimensional array structure, has staggered grid shapes in the two-dimensional directions and are filled with the second encapsulation material layer 1221; along the direction BB and the direction CC in FIG. 5, the first encapsulation material layer 1211 and the second encapsulation material layer 1222 are arranged alternately. With the plurality of grooves 12111 set in a two-dimensional array structure, light emitted by the display element may be scattered and diffracted in direction B-B and direction C-C, so that the total reflection of the light on the interface may be interfered, and hence the light extraction efficiency may be improved.

Figure 6:
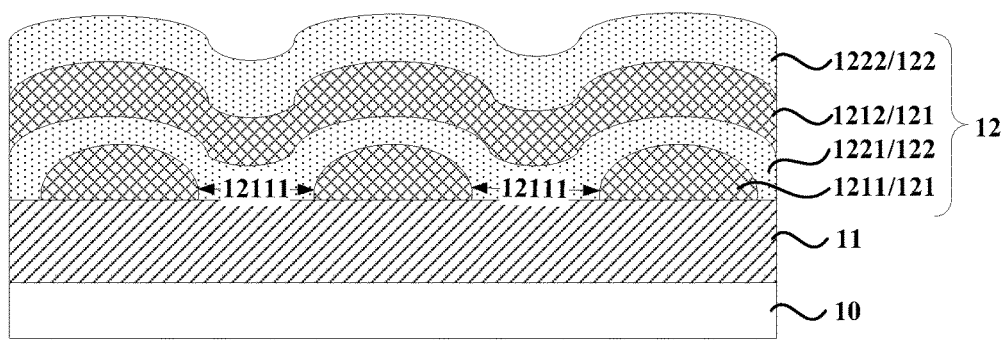
FIG. 6 is a sectional view of another display panel according to one embodiment of the present invention.
Figure 7:
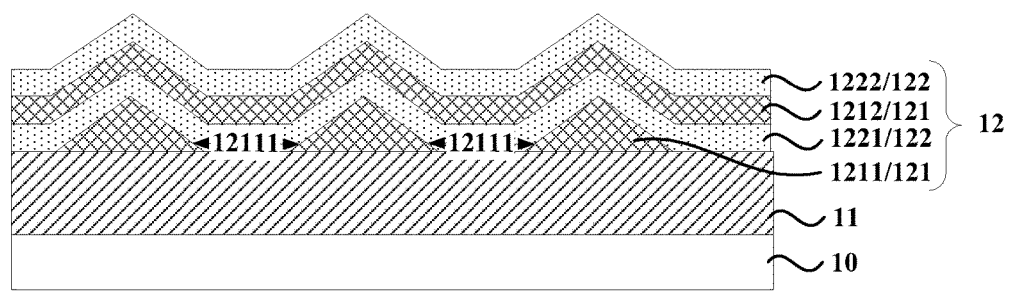
FIG. 7 is a sectional view of another display panel according to one embodiment of the present invention.

It should be noted that, exemplarily in FIG. 1-FIG. 3, the longitudinal section of the structure between adjacent grooves is in the form of a rectangle. In other embodiments, the longitudinal section of the structure between adjacent grooves may also be in the form of an arc or a triangle, etc. FIG. 6 is a sectional view of another display panel according to one embodiment of the present invention. As shown in FIG. 6, the longitudinal section of the structure between adjacent grooves 12111 is in the form of an arc. FIG. 7 is a sectional view of another display panel according to one embodiment of the present invention. As shown in FIG. 7, the longitudinal section of the structure between adjacent grooves 12111 is in the form of a triangle. Exemplarily in FIG. 6 and FIG. 7, the thin-film encapsulation layer 12 includes two first encapsulation material layers 121 and two second encapsulation material layers 122. Along the direction departing from the substrate 10 in FIG. 6 and FIG. 7, the first encapsulation material layers in FIG. 6 and FIG. 7 include in turn a first encapsulation material layer 1211 and a first encapsulation material layer 1212, and the second encapsulation material layers in FIG. 6 and FIG. 7 include in turn a second encapsulation material layer 1221 and a second encapsulation material layer 1222.

Referring to FIG. 1, FIG. 3, FIG. 6 and FIG. 7, because the longitudinal sections of the structures between the grooves have different shapes, the convex shapes of the part of the surface of the first encapsulation material layer and the second encapsulation material layer above the first encapsulation material layer set with a plurality of grooves will be different. For example, in FIG. 1 and FIG. 3, the part of the surface of the first encapsulation material layer and the second encapsulation material layer above the first encapsulation material layer set with a plurality of grooves has the form of a rectangular convex; in FIG. 6, the part of the surface of the first encapsulation material layer and the second encapsulation material layer above the first encapsulation material layer set with a plurality of grooves has the form of an arc convex; and in FIG. 7, the part of the surface of the first encapsulation material layer and the second encapsulation material layer above the first encapsulation material layer set with a plurality of grooves has the form of a pyramidal convex or a conic convex.

Optionally, in the above embodiments, the first encapsulation material layer may be an organic layer, and the second encapsulation material layer may be an inorganic layer; or, the first encapsulation material layer may be an inorganic layer, and the second encapsulation material layer may be an organic layer. That is, the grooves may be provided in the inorganic layer of the thin-film encapsulation layer, or the grooves may be provided in the organic layer of the thin-film encapsulation layer.

Optionally, referring to FIG. 1, FIG. 2, FIG. 3, FIG. 6 and FIG. 7, in the embodiments of the present invention, in the direction perpendicular to the plane including the substrate 10, the first encapsulation material layer 121 and the second encapsulation material layer 122 are arranged in an alternate and stacked manner. By such an arrangement, not only the stress generated during bending may be released and the bending resistance of the display panel may be improved, but also the alternate and stacked arrangement of the first encapsulation material layer 121 and the second encapsulation material layer 122, for example the alternate and stacked arrangement structure of an organic layer and an inorganic layer, may improve the water and oxygen penetration resistance.

Based on the above embodiments, optionally, the large difference between the refractive indexes of the first encapsulation material layer and the second encapsulation material layer may result in the better performance. The larger difference between the refractive indexes can bring the more apparent scattering and diffraction of the light, the stronger interference on the total reflection of the light on the interface, and the higher light extraction efficiency. For example, the difference between the refractive index of the first encapsulation material layer and that of the second encapsulation material layer may be set as larger than 0.3, the refractive index of the first encapsulation material layer may be set as larger than 1.8, and the refractive index of the second encapsulation material layer may be set as less than 1.4; or, the refractive index of the second encapsulation material layer may be set as larger than 1.8, and the refractive index of the first encapsulation material layer may be set as less than 1.4.

Based on the above embodiments, optionally, in the direction parallel with the plane including the first encapsulation material layer, the opening area of the grooves is larger than or equal to $1 \times 10^{-16}$ m$^2$ and is less than or equal to $2.5 \times 10^{-9}$ m$^2$. the space between adjacent grooves is larger than or equal to 0.1 um and is less than or equal to 50 um. With such the arrangement, when the distance between adjacent grooves is sufficiently small, especially is less than 2 um, the light originally trapped in the capping layer and the encapsulation layer may be extracted. The electromagnetic field of the light which occurs the total internal reflection will extend into the low refractive index region of the evanescent standing wave, but the intensity of the electromagnetic field will decrease as the distance from the interface increases. The scattering structure located at the evanescent standing wave needs to be at the same magnitude as the wavelength. Therefore, in the embodiment of the present invention, the opening area of the grooves is set larger than or equal to $1 \times 10^{-16}$ m$^2$ and is less than or equal to $2.5 \times 10^{-9}$ m$^2$, and the space between adjacent grooves is also set larger than or equal to 0.1 um and is less than or equal to 50 um, the light on the film layer interface contacting with the first encapsulation material layer set with a plurality of grooves may be scattered, in order to avoid total reflection, so that the light output efficiency of the device may be improved, thereby the light-emitting efficiency of the device may be improved. In addition, materials with different refractive indexes are arranged periodically, and when the arrangement period is at the same magnitude as the wavelength of the light, a photonic crystal structure may be formed, and hence the propagation of the light on the periodic arrangement direction of the first encapsulation material and the second encapsulation material may be avoided, so that the light only propagates along the light output direction (that is, the direction perpendicular to the substrate 10 and pointing to the thin-film encapsulation layer 12 as shown in FIG. 7), thereby controlling the propagation direction of the light. Therefore, with the structure according to the embodiment of the present invention, the propagation of the light emitted by the display element in the direction parallel with the plane of the substrate may be restricted, so that the loss of the light due to its propagation in the plane may be avoided, and the light emitted by the display element may be modulated to be emitted outward along the light output direction. Therefore, the light output efficiency of the display panel may be improved significantly.

Figure 8:
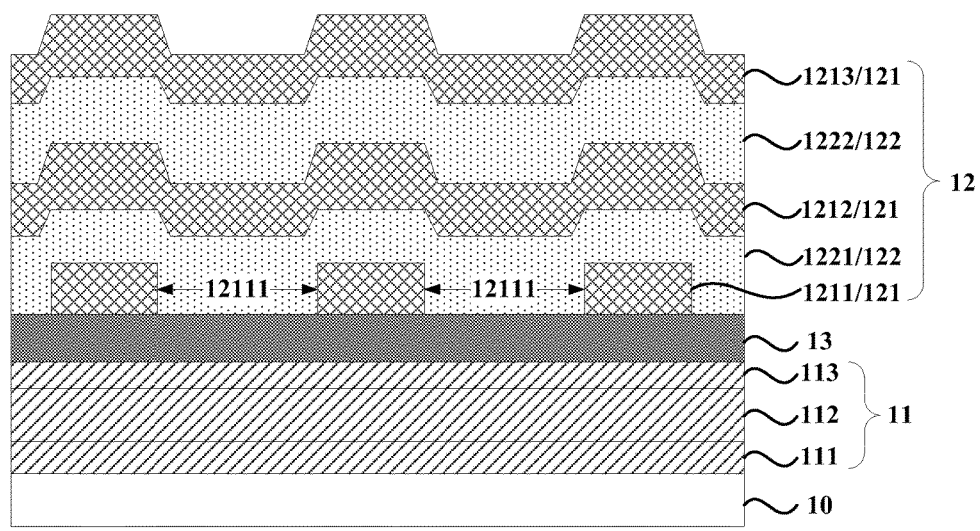
FIG. 8 is a sectional view of another display panel according to one embodiment of the present invention.

FIG. 8 is a sectional view of another display panel according to one embodiment of the present invention. As shown in FIG. 8, the display panel further includes an optical coupling layer 13, which is located between the display element 11 and the thin-film encapsulation layer 12. The refractive index of the optical coupling layer 13 is larger than that of the film layer of the display element 11 which contacts the optical coupling layer 13. The display element provided exemplarily in FIG. 8 is an organic light-emitting display element, which includes an anode 111, a light-emitting functional layer 112 and a cathode 113. In addition, a hole injection layer, a hole transport layer and an electron blocking layer, etc., may also be set between the anode 111 and the light-emitting functional layer 112, and a hole blocking layer, an electron transport layer and an electron injection layer, etc., may also be set between the light-emitting functional layer 112 and the cathode 113. In FIG. 8, the film layer of the display element 11 which contacts the optical coupling layer 13 is the cathode 113, and the refractive index of the optical coupling layer 13 is larger than that of the cathode 113. In the structure of the organic light-emitting display panel, the light-emitting property may be adjusted by involving an optical micro-resonant cavity (micro-cavity structure, for shortly). The micro-cavity structure is formed of a multilayer film between the two electrodes of the organic light-emitting display panel, and the light can be restricted within a very small wavelength region by using the effects of reflection, total reflection, interference, diffraction or scattering, etc., of light on the interfaces with discontinuous refractive indexes. By designing the cavity length and optimizing the thickness of each layer in the cavity, the luminescence center can be made in the vicinity of the antinode of the stationary field in the cavity, and the coupling efficiency of the radiating doublet in the device and the electric field in the cavity may be improved, so that the light-emitting efficiency and the lightness of the device may be improved. The cavity length of the micro-cavity structure corresponding to the organic light-emitting display element is positively correlated to the wavelength (color) of the emitted light. The effective cavity length of the micro-cavity structure may be adjusted by means of the hole injection layer, the hole transport layer, the electron blocking layer, the light-emitting functional layer, the hole blocking layer, the electron transport layer and the electron blocking layer, etc. The optical coupling layer 13 provided between the display element 11 and the thin-film encapsulation layer 12 may fit the micro-cavity structure formed in the organic light-emitting display element, thereby improving the light extraction efficiency.

Optionally, the refractive index of the optical coupling layer 13 is larger than 1.3. The optical coupling layer 13 may include at least one organic coupling layer, which includes at least one of tris(8-hydroxyquinolinolato)aluminium (AlQ$_3$), aromatic amine compound and anthracene compound. In other implementation, the optical coupling layer 13 may include at least one inorganic coupling layer, which includes at least one of LiF, ZnS, ZnSe and MoO$_3$.

Optionally, the optical coupling layer 13 may also include at least one organic coupling layer and at least one inorganic coupling layer, wherein, the organic coupling layer contacts the film layer contacting with the display element, and the inorganic coupling layer contacts the thin-film encapsulation layer. Because the inorganic coupling layer is more stable and more compact than the organic coupling layer, the organic coupling layer is configured to contact with the film layer contacting with the display element, then the inorganic coupling layer is covered, and the inorganic coupling layer contacts the thin-film encapsulation layer, so that the invasion of aqueous vapor and oxygen caused by thermal decomposition of the organic coupling layer during the subsequent evaporation process of the thin-film encapsulation layer may be avoided, and hence the damage of the display element due to the evaporation of the thin-film encapsulation layer may be avoided, and the stability of the display panel may be improved.

Figure 9:
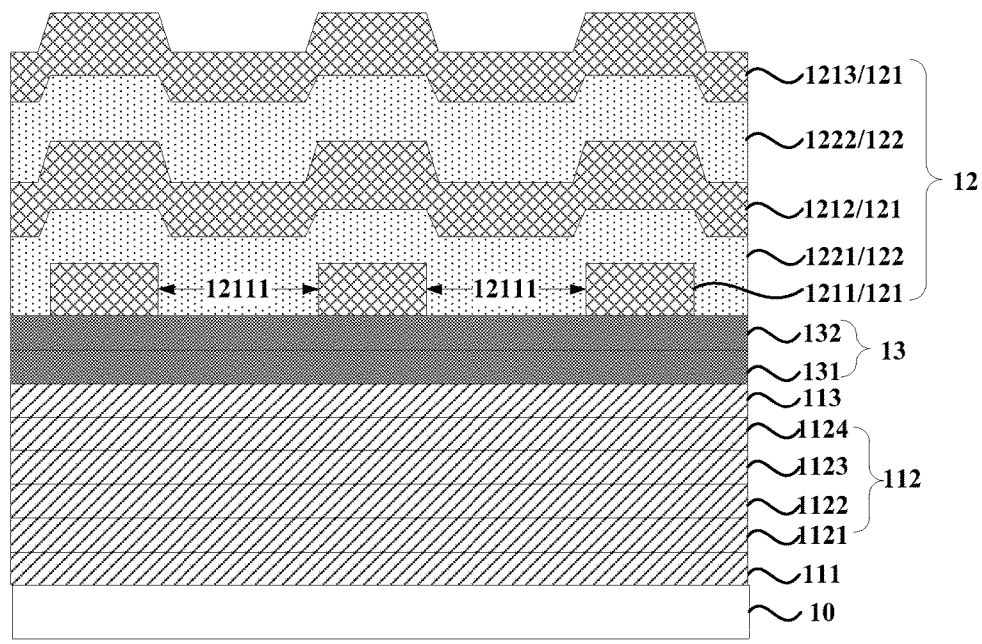
FIG. 9 is a sectional view of the display panel according to the embodiment of the present invention shown in Table 1.

In one embodiment of the present invention, the efficiency, the encapsulation reliability and the bending reliability of the device are further tested. The structure of a device during test according to the embodiment of the present invention is as shown in FIG. 9, which includes in turn, along the direction departing from the substrate: a first electrode 111, a hole injection layer 1121, a hole transport layer 1122, a light-emitting layer 1123, an electron transport layer 1125, a second electrode 113, an organic optical coupling layer 131, an inorganic optical coupling layer 132, a first encapsulation material layer 1211, a second encapsulation material layer 1221, a first encapsulation material layer 1212, a second encapsulation material layer 1222 and a first encapsulation material layer 1213. The first electrode 111 employs a material of tin indium oxide (ITO), with a thickness of 15 nm; the hole injection layer 1121 employs a material of structural formula

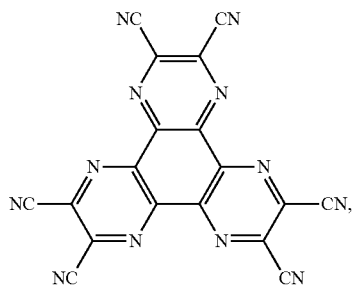 [SMILES: N#Cc1nc2c3nc(C#N)c(C#N)nc3c3nc(C#N)c(C#N)nc3c2nc1C#N]

with a thickness of 10 nm. The hole transport layer 1122 employs a material of structural formula

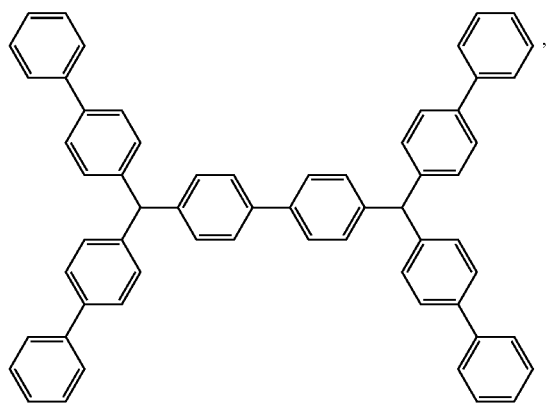 [SMILES: c1ccc(-c2ccc(C(c3ccc(-c4ccccc4)cc3)c3ccc(-c4ccc(C(c5ccc(-c6ccccc6)cc5)c5ccc(-c6ccccc6)cc5)cc4)cc3)cc2)cc1]

with a thickness of 50 nm; the host material of the light-emitting layer 1123 employs a material of structural formula

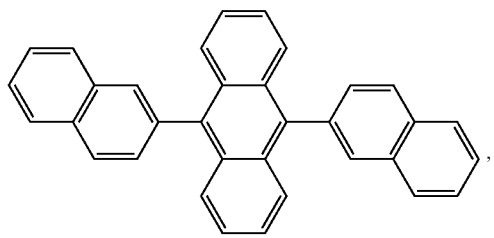 [SMILES: c1ccc2cc(-c3c4ccccc4c(-c4ccc5ccccc5c4)c4ccccc34)ccc2c1]

the guest material thereof employs a material of structural formula

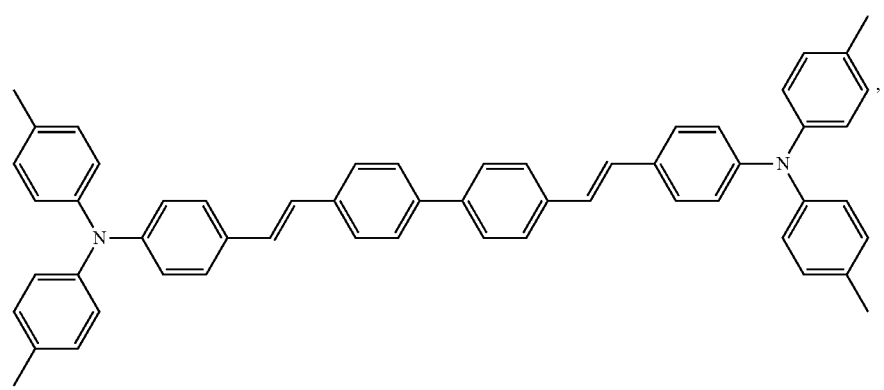 [SMILES: Cc1ccc(N(c2ccc(C)cc2)c2ccc(/C=C/c3ccc(-c4ccc(/C=C/c5ccc(N(c6ccc(C)cc6)c6ccc(C)cc6)cc5)cc4)cc3)cc2)cc1]

and the doped weight percentage of the guest material is 5 wt %, the thickness of the light-emitting layer 1123 is 20 nm; the electron transport layer 1124 employs a material of structural formula

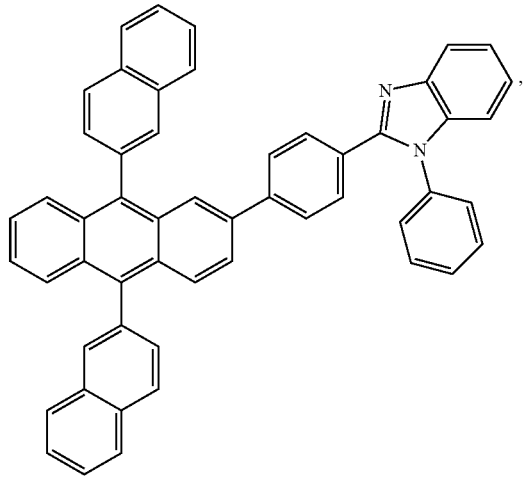 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

and it is doped with 8-hydroxyquinolinolatolithium (Liq), wherein the doped weight percentage of 8-hydroxyquinolinolatolithium (Liq) is 50 wt %, and the thickness of the electron transport layer 1124 is 40 nm. The second electrode 116 employs an Mg—Ag alloy, wherein the weight ratio of Mg to Ag is 10:1, and the thickness of the second electrode 113 is 13 nm; the organic optical coupling layer 131 employs 8-hydroxyquinolinolato aluminium (Alq3), and the thickness of the organic optical coupling layer 131 is 50 nm; the inorganic optical coupling layer 132 employs lithium fluoride, and the thickness of the inorganic optical coupling layer 132 is 20 nm. The first encapsulation material layer 1211 is formed through an atomic layer deposition process by utilizing a mask plate, a plurality of groove structures 12111 are formed on the first encapsulation material layer 1211, and the distance between adjacent grooves is about 10 um. Then, the second encapsulation material layer 1221, the first encapsulation material layer 1212, the second encapsulation material layer 1222 and the first encapsulation material layer 1213 are formed in turn via a plasma chemical vapor deposition process. The first encapsulation material layer 1211, the first encapsulation material layer 1212 and the first encapsulation material layer 1213 all employ a material of $Al_2O_3$, and the thickness of the first encapsulation material layer 1211, the first encapsulation material layer 1212 and the first encapsulation material layer 1213 is 50 nm, 100 nm and 100 nm, respectively. The second encapsulation material layer 1221 and the second encapsulation material layer 1222 both employ hexamethyl disiloxane, with a structural formula of

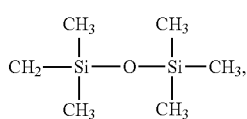

and the thickness of the second encapsulation material layer 1221 and the thickness of the second encapsulation material layer 1222 are both 1 um. In addition, in order to adjust the cavity length of the micro-cavity structure of the display elements that emit light of different colors, in one embodiment of the present invention, a hole auxiliary transport layer is provided between the hole transport layer and the hole injection layer, wherein the thickness of the hole auxiliary transport layer that with respect to the blue light 80 nm, and the material of the hole auxiliary transport layer is the same as that of the hole transport layer. In the device structure of a contrast embodiment used in the test, the first encapsulation material layer 1211 is covered as a whole layer, without groove structures; the structures, materials and thickness of each of the other film layers are the same. Table 1 is a contrast table of the device test effects of an embodiment of the present invention and a contrast embodiment. Referring to Table 1, it may be seen that, relative to the contrast embodiment, the light-emitting efficiency of the embodiment of the present invention is raised by 15%. It may be found from the encapsulation reliability test that, for the device employing the structure of the embodiment of the present invention, the number of devices, of which the luminescence lightness drop is less than 20% after 10 days, is about 50%, but that in the contrast embodiment is only 10%; this indicates that the encapsulation of the device structure according to the embodiment of the present invention is more stable, and the lifetime of the device is improved significantly. The bending reliability test indicates that, for the device of the embodiment of the present invention, the number of bending times corresponding to a luminescence lightness drop of 20% is 1000, but the number of bending times in the contrast embodiment is only 200; this indicates that, by the structure according to the embodiment of the present invention, the bending performance of the device may be improved.

TABLE 1

Comparison between the device test effects of the embodiment of the present invention v.s. contrast embodiment

| | Light-Emitting Efficiency (The light-emitting efficiency of the Contrast Embodiment is defined as 100%) | Encapsulation Reliability (The number of devices of which the luminescence lightness drop is less than 20% after 10 days) | Bending Reliability (The number of bending times corresponding to a luminescence lightness drop of 20%) |
|---|---|---|---|
| Embodiment of The Present Invention | 115% | 50% | 1000 |
| Contrast Embodiment | 100% | 10% | 200 |

Figure 10:
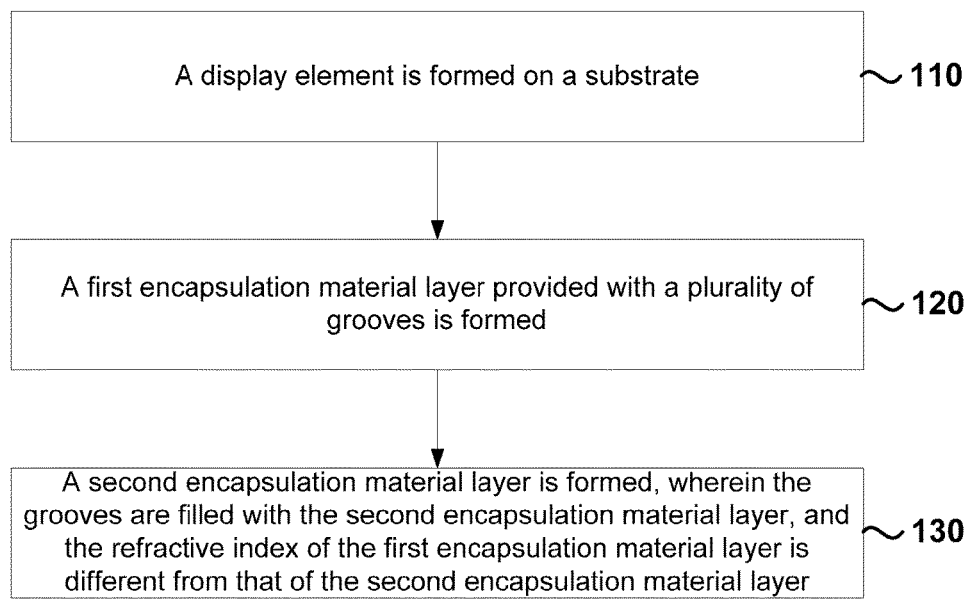
FIG. 10 is a schematic flow chart of a method for manufacturing a display panel according to one embodiment of the present invention.

Based on the same inventive concept, one embodiment of the present invention further provides a method for manufacturing a display panel. FIG. 10 is a schematic flow chart of a method for manufacturing a display panel according to one embodiment of the present invention. As shown in FIG. 10, the method includes:

Step 110: A display element is formed on a substrate.

For example, the display element may be an organic light-emitting display element, and it may also be an electrophoretic display element. The type of the display element is not limited in the embodiments of the present invention.

Step 120: A first encapsulation material layer which is provided with a plurality of grooves is formed.

Step 130: A second encapsulation material layer is formed, wherein the grooves are filled with the second encapsulation material layer, and the refractive index of the first encapsulation material layer is different from that of the second encapsulation material layer.

In the embodiment of the present invention, a plurality of grooves are set on at least one first encapsulation material layer of the thin-film encapsulation layer, and the grooves are filled with the second encapsulation material layer above the first encapsulation material layer set with a plurality of grooves. Therefore, along the plane perpendicular to the groove depth within the grooves, the first encapsulation material and the second encapsulation material are set alternately. The first encapsulation material layer set with a plurality of grooves is disconnected by the second encapsulation material layer and hence has a discontinuous structure, and the second encapsulation material layer is also disconnected by the first encapsulation material layer set with a plurality of grooves, and hence also has a discontinuous structure. Therefore, when the display panel is bent, the stress may be released by the discontinuous structure, so that cracks caused by the accumulation of the stress during bending may be avoided, and hence the invasion of ambient aqueous vapor and oxygen due to the cracks in the first encapsulation material layer or the second encapsulation material layer may be prevented, and hence the lifetime of the display panel may be improved. When the light emitted by the display element is emitted outward, the total reflection of the light on the interface between the display element and the thin-film encapsulation layer, on the interface between the first encapsulation material layer and the second encapsulation material layer of the thin-film encapsulation layer and on the interface between the thin-film encapsulation layer and the air may be interfered by scattering and diffraction. Moreover, the larger difference between the refractive indexes of the first encapsulation material layer and the second encapsulation material layer would result in the more apparent scattering or diffraction effect, so that the light extraction efficiency may be improved.

The Step 120 of forming a first encapsulation material layer which is provided with a plurality of grooves may include: a first encapsulation material layer is formed; and then a plurality of grooves are formed by etching the first encapsulation material layer.

It should be noted that, the above forming a plurality of grooves by etching the first encapsulation material layer may be as shown in FIG. 1, in which the first encapsulation material layer is completely extended through by the grooves; or, the groove depth formed by etching may be less than the thickness of the first encapsulation material layer, as shown in FIG. 3.

Optionally, the Step 120 of forming a first encapsulation material layer provided with a plurality of grooves may also be realized by the steps below:

a first encapsulation material layer is formed; and then a plurality of grooves are formed on the first encapsulation material layer via a nano-imprint process.

By forming a plurality of grooves on the first encapsulation material layer via a nano-imprint process, the damage of the display element by the etching solution and the exposing, etc., in a traditional etching process may be avoided.

Optionally, the Step 130 of forming a second encapsulation material layer includes: a whole second encapsulation material layer is formed, or the spaces between adjacent grooves are filled with a second encapsulation material layer. For example, referring to FIG. 1, the first encapsulation material layer 1211 is covered by the second encapsulation material layer 1221 as a whole layer, and the grooves 12111 are filled with the first encapsulation material layer 1211. Referring to FIG. 2, only the grooves 12111 are filled with the second encapsulation material layer 1221.

Figure 11:
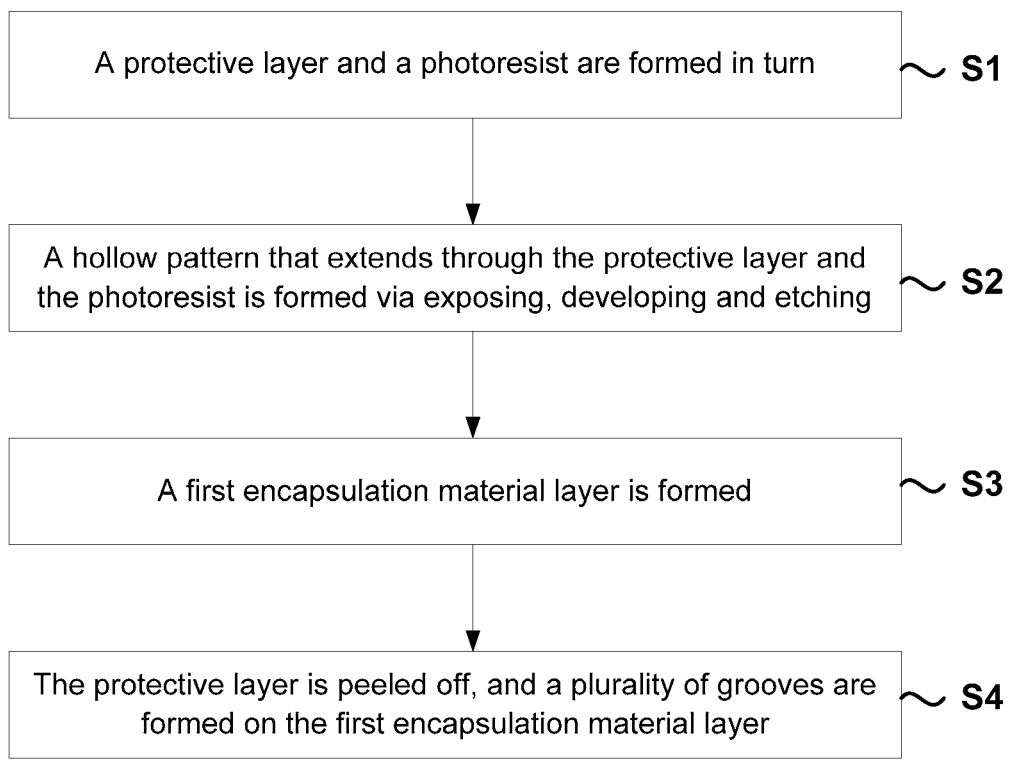
FIG. 11 is a schematic flow chart for forming a first encapsulation material layer provided with a plurality of grooves according to one embodiment of the present invention.

One embodiment of the present invention further provides another way to realize the Step 120. FIG. 11 is a schematic flow chart for forming a first encapsulation material layer provided with a plurality of grooves according to one embodiment of the present invention. FIG. 12A-FIG. 12D are schematic diagrams showing the sectional structures corresponding to each step in FIG. 11. As shown in FIG. 12, it includes:

S1: A protective layer and a photoresist are formed in turn.

Figure 12A:
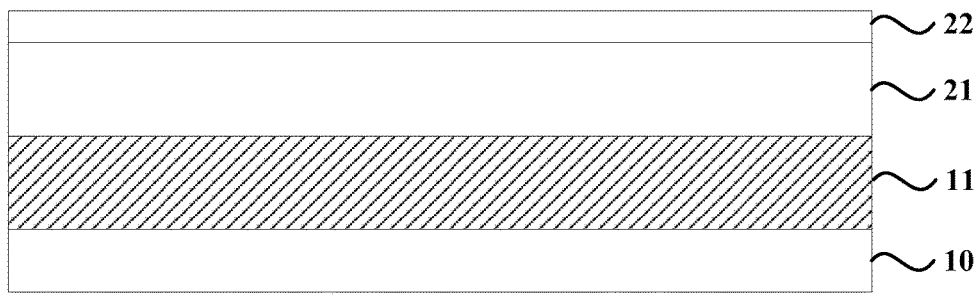
FIG. 12A-FIG. 12D are schematic diagrams showing the sectional structures corresponding to steps in FIG. 11.

Referring to FIG. 12A, before a first encapsulation material layer is formed, a protective layer 21 and a photoresist 22 are first formed in turn.

S2: A hollow pattern that extends through the protective layer and the photoresist is formed via exposing, developing and etching.

Figure 12B:
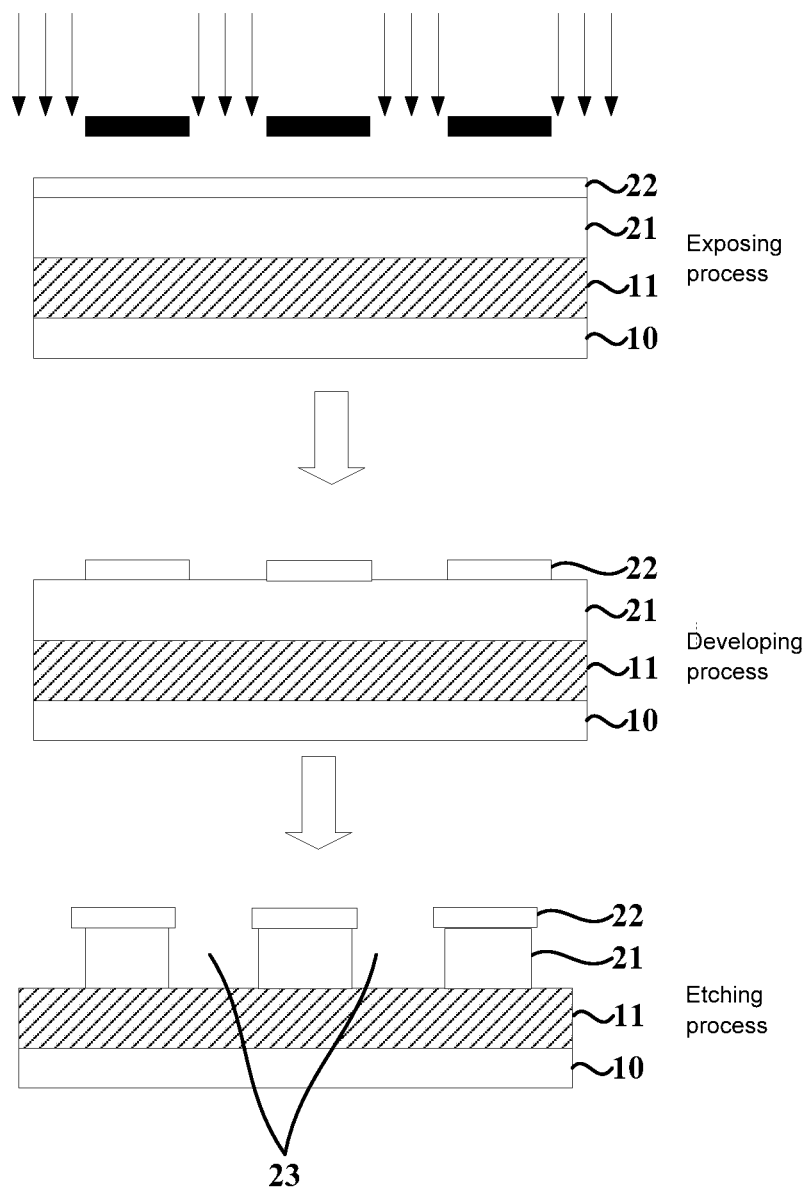

Referring to FIG. 12b, a hollow pattern 23 that extends through the protective layer 21 and the photoresist 22 is formed in turn via exposing, developing and etching. The hollow pattern 23 exposes a part of the display element 11. In this step, a nonaqueous medium is employed during the etching process, for example, perfluorinated ether, which will not damage the OLED device, is employed as the medium for dissolving the protective layer.

S3: A first encapsulation material layer is formed.

Figure 12C:
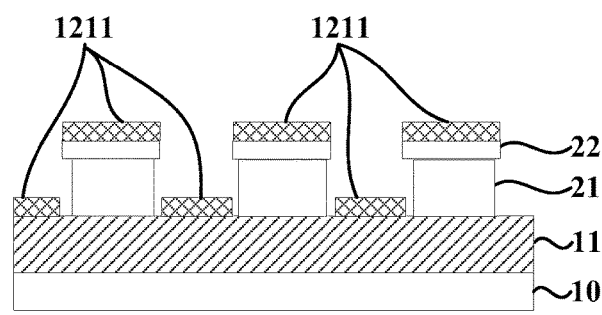

Referring to FIG. 12C, a first encapsulation material layer 1211 is formed, which is deposited in the hollow pattern 23 and covers the photoresist 22 that is not developed.

S4: The protective layer is peeled off, and a plurality of grooves are formed on the first encapsulation material layer.

Figure 12D:
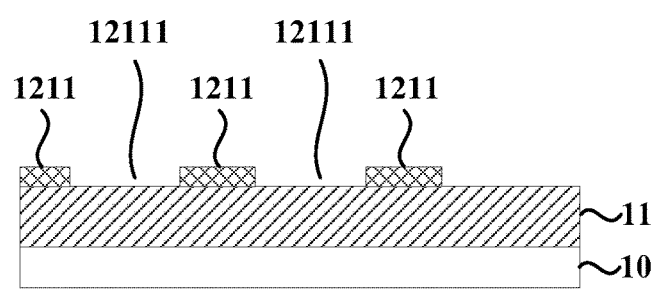

Referring to FIG. 12D, the protective layer 21 is peeled off, so that the photoresist 22 covering the protective layer 21 and the first encapsulation material layer 1211 above the photoresist 22 are also peeled off. Except for the hollow pattern, the grooves 12111 are formed at the locations where the original protective layer 21 exists.

Optionally, in the direction parallel with the plane including the substrate, the grooves may form a one-dimensional array or a two-dimensional array.

Based on each of the above embodiments, optionally, before the Step 120 of forming a first encapsulation material layer provided with a plurality of grooves, the method may further include:

at least one first encapsulation material layer and at least one second encapsulation material layer are formed.

Optionally, after the Step 130 of forming a second encapsulation material layer, the method may further include:

at least one first encapsulation material layer and at least one second encapsulation material layer are formed.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A display panel, comprising:
   a substrate and a display element located on the substrate; and
   a thin-film encapsulation layer located on a light emitting side of the display element, wherein the thin-film encapsulation layer comprises a plurality of first encapsulation material layers and a plurality of second encapsulation material layers, and a refractive index of the first encapsulation material layer is different from that of the second encapsulation material layer; and, wherein each of the first encapsulation material layers is provided with a plurality of grooves, the plurality of grooves are filled with a respective one of the second encapsulation material layers, and each of the second encapsulation material layers is above a respective one of the first encapsulation material layers; wherein a orthographic projection of each of the grooves in one of the first encapsulation material layers on the substrate is coincident with that of a respective one of the grooves in the other ones of the first encapsulation material layers;

wherein groove regions of the thin-film encapsulation layer are regions where the plurality of grooves are disposed, non-groove regions of the thin-film encapsulation layer are regions of the thin-film encapsulation layer where no grooves are disposed, a thickness of each of the groove regions of the thin-film encapsulation layer is less than that of each of the non-groove regions of the thin-film encapsulation layer; and wherein in a direction perpendicular to the substrate, groove regions of at least one of the first encapsulation material layers are regions where grooves of the at least one of first encapsulation material layers are disposed, non-groove regions of the at least one of first encapsulation material layers are regions of the at least one of first encapsulation material layers where no grooves are disposed; and wherein a thickness of each of the groove regions of the at least one of the first encapsulation material layers is less than a thickness of each of the non-groove regions of the at least one of the first encapsulation material layers, or each of the grooves of the at least one of first encapsulation material layers extends through the at least one of first encapsulation material layers.

2. The display panel as claimed in claim 1, wherein in a direction parallel with the substrate, the grooves form a one-dimensional or two-dimensional array.

3. The display panel as claimed in claim 1, wherein the first encapsulation material layers are an organic layer, and the second encapsulation material layers are an inorganic layer; or
the first encapsulation material layers are an inorganic layer, and the second encapsulation material layers are an organic layer.

4. The display panel as claimed in claim 1, wherein in a direction perpendicular to the substrate, the first encapsulation material layers and the second encapsulation material layers are arranged in an alternate and stacked manner.

5. The display panel as claimed in claim 1, wherein the refractive index of the first encapsulation material layers is larger than 1.8, and the refractive index of the second encapsulation material layers is less than 1.4; or
the refractive index of the second encapsulation material layers is larger than 1.8, and the refractive index of the first encapsulation material layers is less than 1.4.

6. The display panel as claimed in claim 1, wherein a difference between the refractive index of the first encapsulation material layers and that of the second encapsulation material layers is larger than 0.3.

7. The display panel as claimed in claim 1, wherein in a direction parallel with the first encapsulation material layer, an opening area of the grooves is larger than or equal to $1 \times 10^{-16}$ m$^2$ and is less than or equal to $2.5 \times 10^{-9}$ m$^2$.

8. The display panel as claimed in claim 1, wherein a space between the grooves adjacent to each other is larger than or equal to 0.1 um and is less than or equal to 50 um.

9. The display panel as claimed in claim 1, further comprising: an optical coupling layer, where the optical coupling layer is located between the display element and the thin-film encapsulation layer, and the refractive index of the optical coupling layer is larger than that of the film layer of the display element which contacts the optical coupling layer.

10. The display panel as claimed in claim 9, wherein the refractive index of the optical coupling layer is larger than 1.3.

11. The display panel as claimed in claim 9, wherein the optical coupling layer comprises at least one organic coupling layer, and the organic coupling layer comprises at least one of tris(8-hydroxyquinolinolato) aluminium (AlQ$^3$), aromatic amine compound and anthracene compound.

12. The display panel as claimed in claim 9, wherein the optical coupling layer comprises at least one inorganic coupling layer, and the inorganic coupling layer comprises at least one of LiF, ZnS, ZnSe and MoO$^3$.

13. The display panel as claimed in claim 9, wherein the optical coupling layer comprises at least one organic coupling layer and at least one inorganic coupling layer; and, wherein, the organic coupling layer contacts the second electrode, and the inorganic coupling layer contacts the thin-film encapsulation layer.

14. The display panel as claimed in claim 1, wherein a longitudinal section of a structure between the grooves adjacent to each other takes a form of a rectangle, an arc or a triangle.

15. The display panel as claimed in claim 1, wherein a part of the surface of the first encapsulation material layer and the second encapsulation material layer above the at least one of the first encapsulation material layers takes a form of a rectangular convex, an arc convex, a pyramidal convex or a conic convex.

16. The display panel as claimed in claim 1, wherein the display element comprises an organic light-emitting display element or an electrophoretic display element.

17. The display panel according to claim 1, wherein the at least one of first encapsulation material layers with the grooves comprises a layer adjacent to the display element.

18. A method for manufacturing a display panel, comprising:
forming a display element on a substrate;
forming a first encapsulation material layer, which is provided with a plurality of grooves, on a light emitting side of the display element; and
forming a second encapsulation material layer, wherein the grooves are filled with the second encapsulation material layer, and the refractive index of the first encapsulation material layer is different from that of the second encapsulation material layer;
wherein the display panel comprising:
a substrate and a display element located on the substrate; and
a thin-film encapsulation layer located on a light emitting side of the display element, wherein the thin-film encapsulation layer comprises a plurality of first encapsulation material layers and a plurality of second encapsulation material layers, and a refractive index of the first encapsulation material layer is different from that of the second encapsulation material layer; and, wherein each of the first encapsulation material layers is provided with a plurality of grooves, and the plurality of grooves are filled with the second encapsulation material layers, each of the second encapsulation material layers being above a respective one of the first encapsulation material layers; wherein a orthographic projection of each of the grooves in one of the first encapsulation material layers on the substrate is coincident with that of a respective one of the grooves in the other ones of the first encapsulation material layers;

wherein groove regions of the thin-film encapsulation layer are regions where the plurality of grooves are disposed, non-groove regions of the thin-film encapsulation layer are regions of the thin-film encapsulation layer where no grooves are disposed, a thickness of each of the groove regions of the thin-film encapsulation layer is less than that of each of the non-groove regions of the thin-film encapsulation layer; and wherein in a direction perpendicular to the substrate, groove regions of at least one of the first encapsulation material layers are regions where grooves of the at least one of first encapsulation material layers are disposed, non-groove regions of the at least one of first encapsulation material layers are regions of the at least one of first encapsulation material layers where no grooves are disposed; and wherein a thickness of each of the groove regions of the at least one of the first encapsulation material layers is less than a thickness of each of the non-groove regions of the at least one of the first encapsulation material layers, or each of the grooves of the at least one of first encapsulation material layers extends through the at least one of first encapsulation material layers.

19. The method according to claim 18, wherein the forming a first encapsulation material layer which is provided with the plurality of grooves comprises:

forming a first encapsulation material layer; and
forming a plurality of grooves by etching the first encapsulation material layer.

20. The method according to claim 18, wherein, the forming a first encapsulation material layer which is provided with the plurality of grooves comprises:

forming a first encapsulation material layer; and
forming a plurality of grooves on the first encapsulation material layer via a nano-imprint process.

21. The method according to claim 18, wherein, the forming a second encapsulation material layer comprises:

forming the second encapsulation material layer entirely, or filling only the grooves with the second encapsulation material layer.

22. The method according to claim 18, wherein, the forming a first encapsulation material layer which is provided with the plurality of grooves comprises:

forming a protective layer and a photoresist in turn;
forming, via photoetching, exposing, and developing etching, a hollow pattern that extends through the protective layer and the photoresist;
forming a first encapsulation material layer; and
peeling off the protective layer, so that the plurality of grooves are formed on the first encapsulation material layer.

23. A display panel, comprising:

a substrate and a display element located on the substrate; and
a thin-film encapsulation layer located on a light emitting side of the display element, wherein the thin-film encapsulation layer comprises a plurality of first encapsulation material layers and a plurality of second encapsulation material layers, and a refractive index of the first encapsulation material layers is different from that of the second encapsulation material layers; and, wherein the first encapsulation material layers are provided with a plurality of first grooves, the first grooves are filled with a respective one of the second encapsulation material layers, each of the second encapsulation material layers is above a respective one of the first encapsulation material layers, and the second encapsulation material layers are provided with a plurality of second grooves; and wherein in a direction perpendicular to the substrate, groove regions are regions of at least one of the first encapsulation material layers where the first grooves are disposed, non-groove regions are regions of the at least one of the first encapsulation material layers where no grooves are disposed; and wherein a thickness of each of the groove regions is less than a thickness of each of the non-groove regions, or each of the first grooves extends through the at least one of the first encapsulation material layers.

* * * * *